(12) United States Patent
Ambrose (10) Patent No.: US 9,972,380 B2
(45) Date of Patent: May 15, 2018

(54) MEMORY CELL HAVING A MAGNETIC JOSEPHSON JUNCTION DEVICE WITH A DOPED MAGNETIC LAYER

(71) Applicant: Microsoft Technology Licensing, LLC, Redmond, WA (US)

(72) Inventor: Thomas F. Ambrose, Crownsville, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days. days.

(21) Appl. No.: 15/218,031

(22) Filed: Jul. 24, 2016

(65) Prior Publication Data
US 2018/0025775 A1    Jan. 25, 2018

(51) Int. Cl.
| | | |
|---|---|---|
| *H01L 29/06* | (2006.01) | |
| *H01L 29/08* | (2006.01) | |
| *G11C 11/44* | (2006.01) | |
| *H01L 39/22* | (2006.01) | |
| *H01L 39/02* | (2006.01) | |

(Continued)

(52) U.S. Cl.
CPC .......... *G11C 11/44* (2013.01); *H01L 39/025* (2013.01); *H01L 39/12* (2013.01); *H01L 39/16* (2013.01); *H01L 39/223* (2013.01)

(58) Field of Classification Search
CPC ......... G11C 11/44; H01L 39/16; H01L 39/12; H01L 39/223; H01L 39/025
See application file for complete search history.

(56) References Cited

U.S. PATENT DOCUMENTS

| | | | | |
|---|---|---|---|---|
| 4,916,335 | A * | 4/1990 | Goto ................ | H03K 19/1952 327/510 |
| 5,872,731 | A * | 2/1999 | Chan ................ | G11C 11/44 257/36 |

(Continued)

FOREIGN PATENT DOCUMENTS

| | | |
|---|---|---|
| WO | 2004032149 A1 | 4/2004 |
| WO | 2007013887 A2 | 2/2007 |
| WO | 2013180946 A1 | 12/2013 |

OTHER PUBLICATIONS

Niedzielski, et al., "Use of Pd—Fe and Ni—Fe—Nb as Soft Magnetic Layers in Ferromagnetic Josephson Junctions for Non-volatile Cryogenic Memory", In Journal of IEEE transactions on applied superconductivity, vol. 24, Issue 4, Aug. 2014, 7 pages.
Sato, et al., "Magnetic and Mechanical Properties of a 6%V Permalloy as Magnetic Head Materials", In Journal of Transactions of the Japan Institute of Metals, vol. 26, Issue 8, Retrieved on: May 30, 2016, pp. 587-594.

(Continued)

*Primary Examiner* — Ismail Muse
(74) *Attorney, Agent, or Firm* — Singh Law, PLLC; Ranjeev Singh (57) ABSTRACT

Examples described in this disclosure relate to a memory cell having a magnetic Josephson junction device with a doped magnetic layer. In one example, a memory cell including a magnetic Josephson junction (MJJ) device is provided. The MJJ device may include at least a first layer formed above a second layer and a third layer formed below the second layer, where the first layer is a free magnetic layer, the second layer is a non-magnetic layer, where the third layer is a fixed magnetic layer. The free magnetic layer may comprise a magnetic alloy doped with at least one of Vanadium, Zirconium, Molybdenum, or Hafnium, and the fixed magnetic layer may comprise an un-doped second magnetic alloy.

18 Claims, 5 Drawing Sheets

(51) Int. Cl.
*H01L 39/12* (2006.01)
*H01L 39/16* (2006.01)

(56) References Cited

U.S. PATENT DOCUMENTS

| | | | |
|---|---|---|---|
| 6,414,870 B1 | 7/2002 | Johnson et al. | |
| 8,018,690 B2* | 9/2011 | Min | B82Y 10/00 360/324.12 |
| 8,270,209 B2* | 9/2012 | Herr | G11C 11/44 365/158 |
| 8,754,460 B2 | 6/2014 | Pietambaram et al. | |
| 8,971,977 B2 | 3/2015 | Mukhanov et al. | |
| 9,281,057 B1 | 3/2016 | Herr et al. | |
| 2004/0228045 A1 | 11/2004 | Hasegawa et al. | |
| 2006/0255987 A1* | 11/2006 | Nagasawa | G11C 11/44 341/87 |
| 2007/0242395 A1 | 10/2007 | Bailey | |
| 2009/0057652 A1* | 3/2009 | Nevirkovets | B82Y 10/00 257/35 |
| 2009/0244958 A1* | 10/2009 | Bulzacchelli | G11C 8/14 365/158 |
| 2010/0316890 A1* | 12/2010 | Choi | B82Y 10/00 428/811.1 |
| 2011/0241141 A1* | 10/2011 | Nagai | G11C 11/16 257/421 |
| 2012/0302446 A1 | 11/2012 | Ryazanov et al. | |
| 2013/0302913 A1* | 11/2013 | Uchida | B82Y 25/00 438/3 |
| 2013/0334630 A1* | 12/2013 | Kula | H01L 43/02 257/421 |
| 2014/0035074 A1* | 2/2014 | Jan | H01L 43/08 257/421 |
| 2014/0183673 A1* | 7/2014 | Zhang | H01L 29/82 257/421 |
| 2014/0346518 A1* | 11/2014 | Kariyada | G11C 11/161 257/53 |
| 2014/0346625 A1* | 11/2014 | Fukumoto | B82Y 25/00 257/421 |
| 2015/0043273 A1* | 2/2015 | Naaman | G11C 11/44 365/162 |
| 2015/0063019 A1* | 3/2015 | Dieny | G11C 11/15 365/158 |
| 2015/0171315 A1* | 6/2015 | Gan | H01F 10/3286 257/421 |
| 2015/0235660 A1* | 8/2015 | Wang | G11B 5/3909 428/811.1 |
| 2016/0012882 A1 | 1/2016 | Bleloch | |
| 2016/0276405 A1* | 9/2016 | Kinney | H01L 43/08 |
| 2016/0301000 A1* | 10/2016 | Kim | H01L 43/02 |
| 2016/0351793 A1* | 12/2016 | Sandhu | H01L 43/02 |
| 2017/0018703 A1* | 1/2017 | Freitag | H01L 43/02 |
| 2017/0140806 A1* | 5/2017 | Liu | G11C 11/16 |

OTHER PUBLICATIONS

Robinson, et al., "Supercurrent enhancement in Bloch domain walls", In Journal of Scientific Reports, vol. 2, Sep. 26, 2012, pp 1-6.

Baek, et al., "Hybrid superconducting-magnetic memory device using competing order parameters", In Journal of Nature communications, vol. 5, May 28, 2014, pp. 1-18.

Lepadatu, et al., "Domain-wall pinning, nonadiabatic spin-transfer torque, and spin-current polarization in permalloy wires doped with vanadium", In Journal of Physical Review B, vol. 81, No. 2, Jan. 29, 2010, 5 pages.

Ramzia, et al., "Niobium and Aluminum Josephson Junctions Fabricated with a Damascene CMP Process", In Journal of Physics Procedia, vol. 36, Dec. 31, 2012, pp. 211-216.

Radović, et al., "Transition temperatures of superconductor-ferromagnet superlattices", In Journal of Physical Review B, vol. 44, Issue 2, Jul. 1, 1991.

Goldobin, et al., "Memory Cell based on a Josephson junction", In Journal of Applied Physics Letters, Jun. 20, 2013, 5 pages.

Bell, et al., "Controllable Josephson current through a pseudospin-valve structure", In Journal of Applied Physics Letters, vol. 84, No. 7, Feb. 16, 2004, 3 pages.

Moruzzi, et al., "Calculated Electronic Properties of Metals", In Publication of Pergamon, Jan. 1, 1978.

Baibich, et al., "Giant Magnetoresistance of (001)Fe/(001)Cr Magnetic Superlattices", In Journal of Physical Review Letters, vol. 61, Issue 21, Nov. 21, 1988, pp. 2472-2475.

Grünberg, et al., "Layered Magnetic Structures: Evidence for Antiferromagnetic Coupling of Fe Layers across Cr Interlayers", In Journal of Physical Review Letters, vol. 57, Issue 19, Nov. 10, 1986.

Scheck, et al., "Low Relaxation Rate in Epitaxial Vanadium-Doped Ultrathin Iron Films", In Journal of Physical Review Letters, vol. 98, Issue 11, Mar. 12, 2007.

Baek, et al., "Magnetic Barrier Structures for Superconducting-magnetic Hybrid Josephson Junctions", In IEEE Proceedings, Superconducting Electronics Conference, 2013.

Fullerton, et al., "150% Magnetoresistance in Sputtered Fe/Cr(100) Superlattices", In Applied Physics Letters, vol. 3 (12), Sep. 1993, pp. 1699-1701.

Niedzielski, et al., "S/F/S Josephson junctions with single-domain ferromagnets for memory applications", In Journal of the Superconductor Science and Technology, vol. 28, No. 8, Jul. 6, 2015, pp. 1-5.

"International Search Report and Written Opinion Issued in PCT Application No. PCT/US2017/042951", dated Oct. 9, 2017, 14 Pages.

Qader, et al., "Switching at small magnetic fields in Josephson junctions fabricated with ferromagnetic barrier layers", In Journal of the Applied Physics Letters, vol. 104, No. 2, Jan. 16, 2014, 5 Pages.

* cited by examiner

MEMORY CELL HAVING A MAGNETIC JOSEPHSON JUNCTION DEVICE WITH A DOPED MAGNETIC LAYER

BACKGROUND

Semiconductor based integrated circuits used in electronic devices, such as random access memories, include digital circuits based on complimentary metal-oxide semiconductor (CMOS) technology. CMOS technology, however, is reaching its limits in terms of the device size. In addition, leakage current in CMOS based memories is causing high power consumption even when these memories are not being accessed.

As an example, servers in a data center are increasingly consuming large amounts of power. The consumption of power is partly the result of power loss from the dissipation of energy even when the CMOS circuits are inactive. This is because even when such circuits, such as random access memories, are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing operations, such as read/write, a certain amount of power is wasted not only as a result of the requirement to maintain the state of the CMOS transistors, but also as a result of the current leakage.

An alternative approach to CMOS technology based memory is a superconducting logic based memory.

SUMMARY

In one example, the present disclosure relates to a memory cell including a magnetic Josephson junction (MJJ) device. The MJJ device may include at least a first layer formed above a second layer and a third layer formed below the second layer, where the first layer is a free magnetic layer, the second layer is a non-magnetic layer, where the third layer is a fixed magnetic layer. The free magnetic layer may comprise a magnetic alloy doped with at least one of Vanadium, Zirconium, Molybdenum, or Hafnium, and the fixed magnetic layer may comprise an un-doped second magnetic alloy.

In another aspect, the present disclosure relates to a memory cell including a magnetic Josephson junction (MJJ) device. The MJJ device may include a first layer formed above a second layer and a third layer formed below the second layer. The first layer may be a free magnetic layer; the second layer may be a non-magnetic layer; and the third layer may be a fixed magnetic layer. The free magnetic layer may comprise a nickel-iron alloy doped with only Vanadium, where a concentration of the Vanadium may be in a range between 5 atomic percent to 20 atomic percent. The fixed magnetic layer may comprise a nickel-iron alloy doped with only Vanadium, where a concentration of the Vanadium may be between 5 atomic percent to 10 atomic percent.

In yet another aspect, the present disclosure relates to a memory cell including a magnetic Josephson junction (MJJ) device. The MJJ device may include at least: (1) a first layer and a second layer formed above a third layer, and (2) a fourth layer and a fifth layer formed below the third layer. Each of the first layer and the second layer may be a free magnetic layer; the third layer may be a non-magnetic layer; and each of the fourth layer and the fifth layer may be a fixed magnetic layer. Each of the free magnetic layers may comprise a magnetic alloy doped with at least one of Vanadium, Zirconium, Molybdenum, or Hafnium. Each of the fixed magnetic layers may comprise an un-doped second magnetic alloy.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Examples described in this disclosure relate to superconducting logic based memory devices, including Josephson Magnetic Random Access Memories (JMRAMs). Certain examples further relate to reciprocal quantum logic (RQL) compatible JMRAMs. Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Superconductors, such as niobium, have a critical temperature (Tc) below which they have zero resistance. Niobium, one such superconductor, has a critical temperature (Tc) of 9.3 Kelvin degrees. At temperatures below Tc, Niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type of junctions, the superconducting electrons are described by a quantum mechanical wave-function. A changing phase difference in time of the phase of the superconducting electron wave-function between the two superconductors corresponds to a potential difference between the two superconductors. In RQL circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits including transmission lines can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power thereby eliminating the ground return current. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates include an AND gate, an OR gate, a logical A-and-not-B (AanB) gate and a logical AND & OR (AndOr) gate. The AanB gate may have two inputs and one output (Q). An input pulse A may propagate to output Q unless an input pulse B comes first. The AndOr gate may have two inputs and two outputs (Q1 and Q2). The first input pulse, input pulse A or input pulse B, goes to output Q1 and the second input pulse goes to output Q2. The logical behavior of these gates may be based on the reciprocal data encoding mentioned earlier. As an example, a positive pulse changes the internal flux state of the inductive loop, but the trailing negative pulse erases the internal state every clock cycle, which in turn produces combinational logic behavior.

In general, microwave signals (e.g., SFQ pulses) may be used to control the state of a memory cell. During read/write operations, word-lines and bit-lines may be selectively activated by SFQ pulses arriving via an address bus. These pulses may, in turn, control word-line and bit-line drivers that may provide word-line and bit-line currents to the relevant memory cells. An example memory cell may include at least one Magnetic Josephson junction (MJJ) device. In one example, the MJJ device may include at least one fixed magnetic layer and at least one free magnetic layer. In one state, the magnetic polarity associated with the free magnetic layer may be substantially parallel to the magnetic polarity associated with the fixed magnetic layer. This state of the MJJ device may be referred to as the parallel state. In another state, the magnetic polarity associated with the free magnetic layer may be substantially orthogonal to the magnetic polarity associated with the fixed magnetic layer. This state of the MJJ device may be referred to as the anti-parallel state. By manipulating the magnetic polarity of the MJJ device, a memory cell can be implemented. An example memory cell may include a first MJJ device in parallel with a second MJJ device. The combination of these two may be configured such that under the application of appropriate amounts of current bias and magnetic flux, the memory cell may be in a logic '1' state or in a logic '0' state. In one example, if the memory cell is in the logic '1' state, under the application of a current via a word-line, the MJJ may transition into a "voltage state." A sense amplifier coupled to the memory cell may sense the voltage as being representative of the logic '1' state. The logic '0' state may correspond to a "substantially zero-voltage state," such that in the logic '0' state, despite the application of a current via a word-line, the MJJ may stay in the "substantially zero-voltage state." The sense amplifier may sense this as being representative of the logic '0' state.

Memory cells may be arranged in rows and columns, such that each row can be activated by a common flux bias (e.g., a read word-line signal) and each bit-line may form a transmission line that may propagate the output of the memory cells in a voltage state to a sense amplifier at one end of the column. Memory cells in a column may be serially biased by a common current source; for example, a flux pump.

Figure 1:
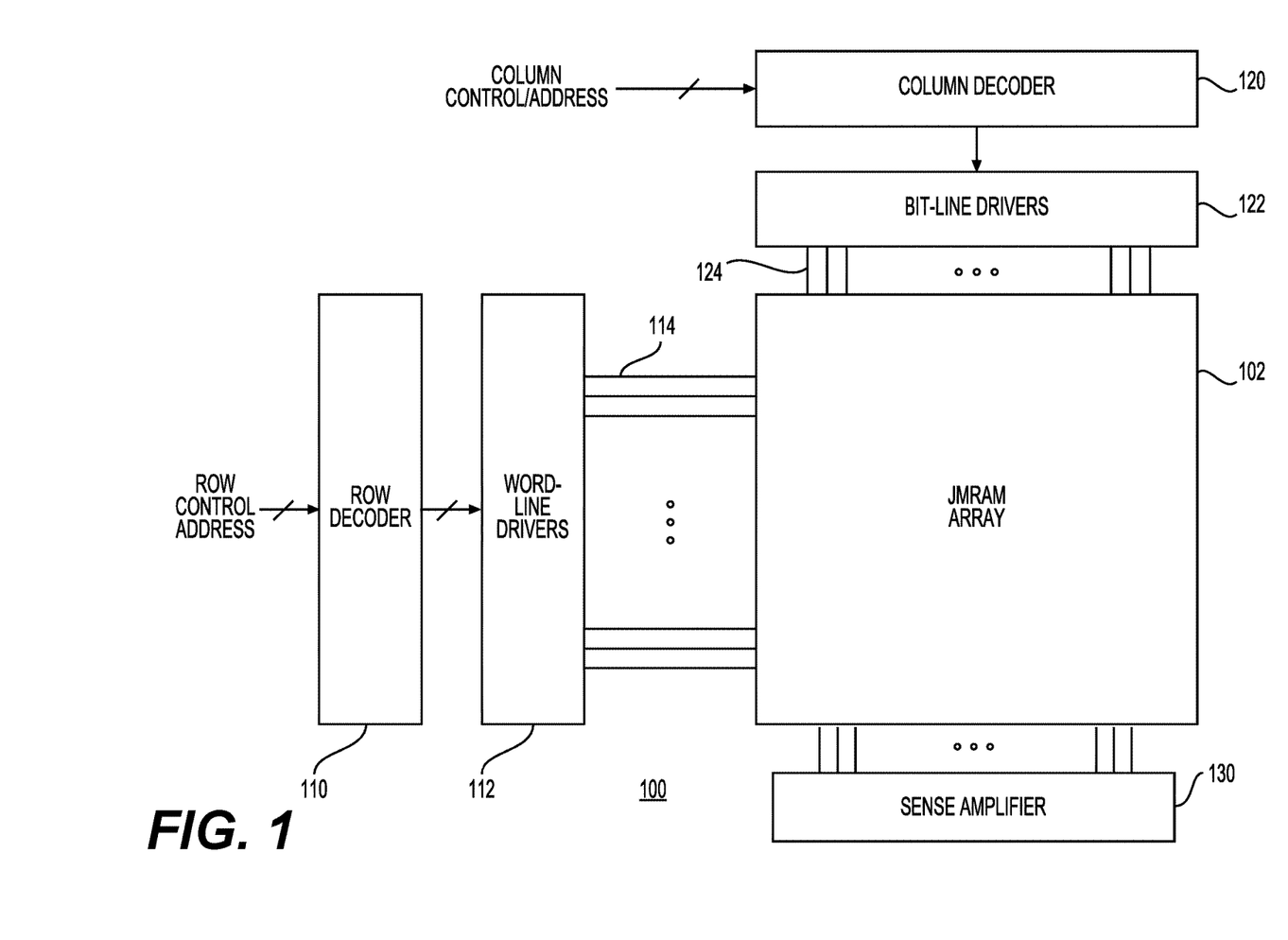
FIG. 1 shows a diagram of a memory system in accordance with one example.

FIG. 1 shows a diagram of a memory system 100 in accordance with one example. Memory system 100 may include an array 102 of memory cells arranged in rows and columns. In one example, array 102 may be an array of memory cells, e.g., Josephson Magnetic Random Access (JMRAM) memory cells. Memory system 100 may further include a row decoder 110 that may be configured to decode row control/address signals. Row decoder 110 may further be coupled to word-line drivers 112. Word-line drivers 112 may include circuitry to provide word-line read/write current to a subset or all of the memory cells associated with a selected word-line for any read or write operations. Word-line drivers 112 may provide such current via word-lines 114. Word-lines 114 may include both read word-lines and write word-lines. In other words, different word-lines may be used to provide current to the selected memory cells for read or write operations. Memory system 100 may further include column decoder 120 that may be configured to decode column control/address signals. Column decoder 120 may further be coupled to bit-line drivers 122. Bit-line drivers 122 may include circuitry to provide bit-line read current to a subset or all of the memory cells associated with a selected bit-line for any read or write operations. Bit-line drivers 122 may provide such current via bit-lines 124. Bit-lines 124 may include both read bit-lines and write bit-lines. In other words, different bit-lines may be used to provide current to the selected memory cells for read or write operations. By using row and column addresses, any of the memory cells could be accessed using an address. Each of the bit-lines (e.g., bit-lines 124) may further be coupled to sense amplifier 130 for sensing bit-lines to determine the logical state of each of the array 102 of memory cells. The coupling between the array 102 of memory cells and sense amplifier 130 may include radio frequency (RF) transmission lines. The memory cells in each column may be serially current-biased by a common current source (e.g., a flux pump). As described earlier, bit-lines 124 may be used to couple this current to each of the memory cells in a column. As described with respect to FIG. 2, sense amplifier 130 may measure the bit-line current or the bit-line voltage to determine a state of a memory cell. Although FIG. 1 shows a certain number of components of memory system 100 arranged in a certain manner, there could be more or fewer number of components arranged differently.

Figure 2:
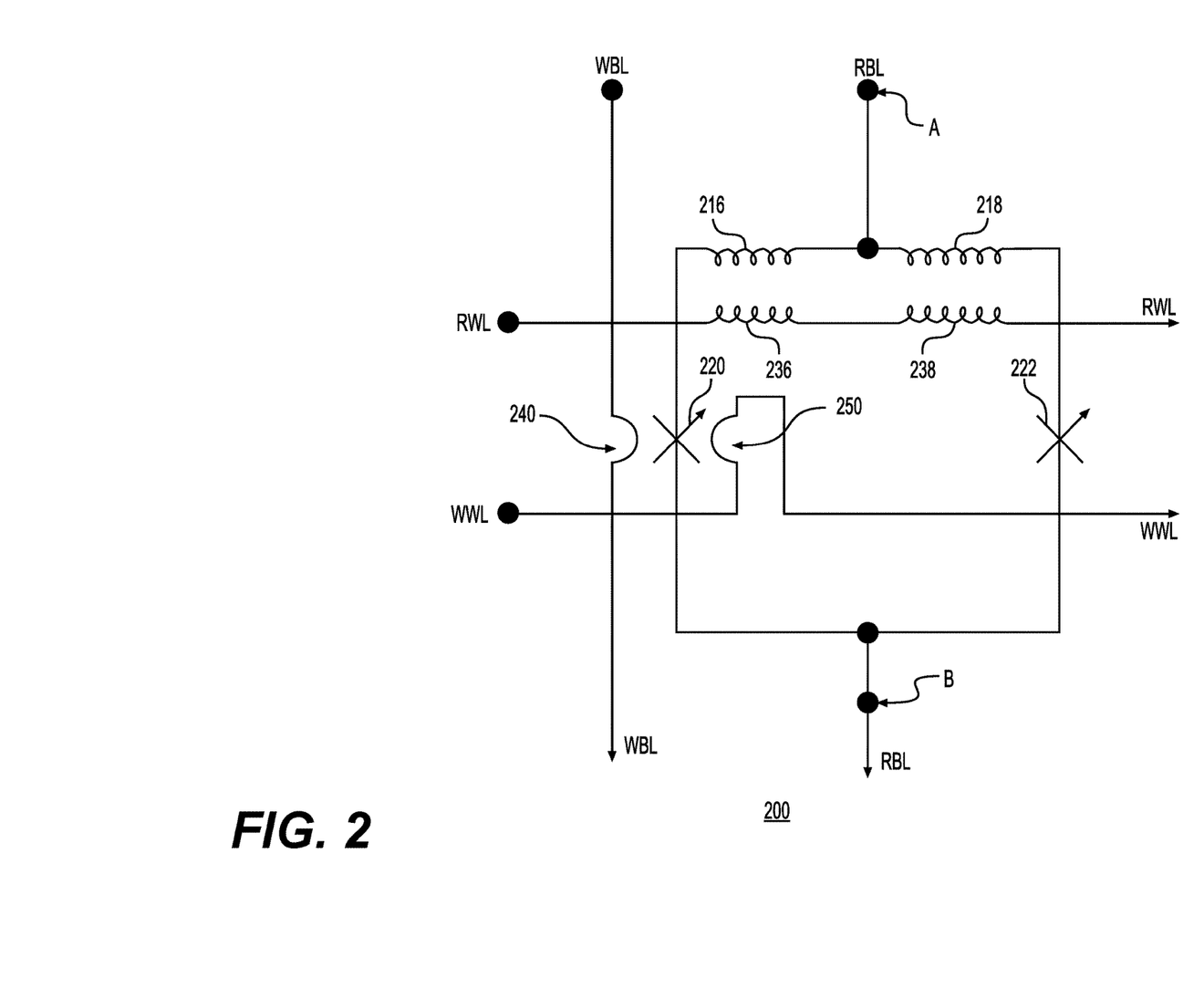
FIG. 2 shows a diagram of a memory cell in accordance with one example.

FIG. 2 shows a diagram of a memory cell 200 in accordance with one example. In one example, memory cell 200 may include a first magnetic Josephson junction (MJJ) device 220 and a second magnetic Josephson junction (MJJ) device 222. Memory cell 200 may further include two inductors 216 and 218. In one example, MJJ 220 and MJJ 222 may form a readout superconducting quantum interference device (SQUID).

With continued reference to FIG. 2, memory cell 200 may be coupled to word-lines and bit-lines for performing various memory operations, including, for example read and write operations. As an example, a read word-line (RWL) for performing a read operation may be coupled to memory cell 200. A write word-line (WWL) for performing a write operation may be coupled to memory cell 200. In addition, a read bit-line (RBL) for performing a read operation may be coupled to memory cell 200. A write bit-line (WBL) for performing a write operation may also be coupled to memory cell 200. Each of the word-lines may be one of the word-lines 114 of FIG. 1. Similarly, each of the bit-lines may be one of the bit-lines 124 of FIG. 1. Inductors 216 and 218 may be coupled to a read bit-line (RBL) as shown in FIG. 2. Memory cell 200 may further include inductors 236 and 238 for coupling the read word-line (RWL) as shown in FIG. 2. The write bit-line (WBL) may also be used to form a coupling 240, which may alter the magnetic polarity of the free magnetic layer of MJJ device 220. Additionally, as shown in FIG. 2, the write word-line (WWL) may also be used to form a coupling 250, which may alter the magnetic polarity of the free magnetic layer of MJJ device 220. During a write operation, current may be coupled via WBL and WWL to MJJ device 220. The combined write current may generate a magnetic field to set the binary value of MJJ device 220 to logic "1" or logic "0" depending upon the direction the current flows through WBL and WWL. The binary value stored in memory cell 200 may be read by supplying read currents on RBL and RWL. MJJ 224 may act as a reference.

The write bit-line may be magnetically coupled to MJJ 220. In one example, coupling with MJJ 220 may be such that a magnetic field generated by at least one of the magnetic barrier layers of MJJ 220 and MJJ 222 can be changed by the application of a local read word-line current and by the application of a local bit-line current. In one example, each of MJJ 220 may be in a first state (e.g., corresponding to a first configuration of magnetization of the at least one free magnetic layer) and a second state (e.g., corresponding to a second configuration of magnetization of the at least one free magnetic layer), where the first configuration of the magnetization may be substantially different from the second configuration of the magnetization. In one example, MJJ 220 and may be in one state when the magnetic fields generated by the fixed magnetic layer and the free magnetic layer oppose each other. In one example, this state may be the "zero state" of MJJ 220. MJJ 220 may be in a different state when the magnetic fields generated by the free magnetic layer and the fixed magnetic layer support each other. In one example, this state may be the "π state." In the "π state," MJJ 220 may apply flux such that under the application of a word read current via inductors 236 and 238, the induced currents due to the flux generated by MJJ 220 and by the coupling of the word-read current to inductors 216 and 218, may combine with a bit-read current applied at node A to trigger the memory cell into a voltage state. This voltage may generate a current along the read bit-line, which may act as a transmission line with a certain impedance. This current may be sensed using a sense amplifier.

With continued reference to FIG. 2, during a read operation, the read word-line (RWL) and the read bit-line (RBL) may receive current from the respective drivers (e.g., word-line drivers 112 and bit-line drivers 122 of FIG. 1). In one example, read word-line (RWL) may be coupled to inductor 236 and inductor 238. Although FIG. 2 shows inductors 236 and 238 as discrete components, they may not be, as the inductance may be derived from an arrangement of the layers of materials used to manufacture memory cell 200. In one example, read bit-line (RBL) may be coupled directly to memory cell 200 and provide a local bit-line current. In one state (e.g., the π state), MJJ 220 may provide a flux bias to the readout SQUID formed by the MJJs. During a read operation, the flux bias from MJJ 220 may add to the flux generated by the current flowing through the local read word-line, causing the readout SQUID to transition to a voltage state. In a second state (e.g., the zero state), MJJ 220 may not provide any flux bias to the readout SQUID. The flux generated as a result of the current flowing through the local read word-line may not be enough to drive the readout SQUID into a voltage state. The change in an output voltage, current, or any other parameter of memory cell 200 may be sensed using a sense amplifier (e.g., sense amplifier 130 of FIG. 1). In one example, the presence or absence of a current pulse, once amplified by the sense amplifier, may determine the state of memory cell 200 as logic '0' or logic '1'. As an example, the logic '1' state may correspond to a "voltage state," in which a sense amplifier coupled to the memory cell may sense the voltage as being representative of the logic '1' state. The logic '0' state may correspond to a "substantially zero-voltage state," such that the sense amplifier may sense this as being representative of the logic '0' state. In this example, the voltage of memory cell 200 depends upon the application of the current via the read word-line (RWL). Nodes A and B, shown in FIG. 2, may be viewed as terminals of a radio frequency transmission line. The impedance of memory cell 200 may be determined based on the inductance (L), from node A to node B, and by the capacitance (C) of memory cell 200 with respect to a ground using the equation:

$$Z = \sqrt{\frac{L}{C}}.$$

Although FIG. 2 shows a certain number of components of a memory cell 200 arranged in a certain manner, there could be more or fewer number of components arranged differently.

Figure 3:
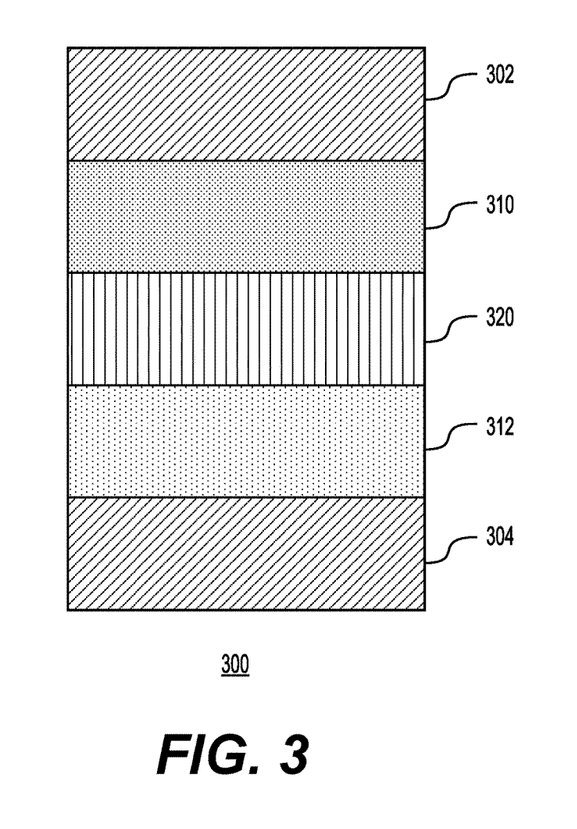
FIG. 3 shows a Magnetic Josephson Junction (MJJ) device in accordance with one example.

FIG. 3 shows a Magnetic Josephson Junction (MJJ) device 300 in accordance with one example. In one example, MJJ device 220 and MJJ device 224 of FIG. 2 may be configured as MJJ device 300. In this example, MJJ device 300 may include a conductive layer 302 and another conductive layer 304, as shown in FIG. 3. In this example, conductive layer 302 and conductive layer 304 may be formed using Niobium. In this example, the thickness of each of these conductive layers may be 100 Angstroms to 500 Angstroms. MJJ device 300 may further include non-magnetic layer 320, which may be sandwiched between a free magnetic layer 310 and a fixed magnetic layer 312. Thus, in this example, free magnetic layer 310 may be formed above non-magnetic layer 320 and fixed magnetic layer 312 may be formed below non-magnetic layer 320. There could be intervening layers between any of these layers. The terms above and below are merely used to indicate that free magnetic layer 310 is on one side of non-magnetic layer 320 and fixed magnetic layer 312 is formed on the other side of non-magnetic layer 320. These terms do not imply a particular order of creating these layers. In other words, in the context of this disclosure, above may mean below and below may mean above.

In one example, free magnetic layer 310 may have very soft magnetic properties to allow for switching of the magnetization direction in response to small magnetic fields. As an example, at liquid helium temperature, free magnetic layer 310 may have saturation magnetization below 350 emu/cc, a coercivity value of less than 10 Oersted, and an anisotropy field value of less than 20 Oersted. Free magnetic layer 310 may include a first magnetic alloy doped with at least one of Vanadium, Zirconium, Molybdenum, or Hafnium. As an example, free magnetic layer 310 may include doped alloy $V_{20}(Ni_{75}Fe_{25})_{80}$. Thus, free magnetic layer 310 may include a Nickel-Iron (Ni—Fe) alloy doped with Vanadium (V). Vanadium may have a concentration of 20 atomic percent and the Ni—Fe alloy may have a concentration of 80 atomic percent. Within the Ni—Fe alloy, Ni may have a concentration of 75 atomic percent and Fe may have a concentration of 25 atomic percent. In one example, Vanadium may have a concentration in a range between 1-40 atomic percent and the Ni—Fe alloy may have a concentration in a range between 60-99 atomic percent. Within Ni—Fe alloy, the concentration of Ni may be varied between 75 atomic percent to 95 atomic percent and the concentration of Fe may be varied between 5 atomic percent to 25 atomic percent. In one example, free magnetic layer 310 may be 15 Angstroms in thickness. In this example, fixed magnetic layer 312 may be formed using an un-doped magnetic alloy. In another example, fixed magnetic layer 312 may have a lower amount of doping than free magnetic layer 310. In one example, fixed magnetic layer 312 may have a larger hysteresis than the hysteresis for free magnetic layer 310. Fixed magnetic layer 312 may also have a larger coercivity value (HC) compared to free magnetic layer 310. Fixed magnetic layer 312 may also have a large squareness (remnant magnetization (MR)/saturation magnetization (MS) ratio). The thickness of fixed magnetic layer 312 may be selected to enable the transition of MJJ device between a "zero state" and a "π state." As an example, fixed magnetic layer 312 may include doped alloy $V_{10}(Ni_{80}Fe_{20})_{90}$. Thus, fixed magnetic layer 312 may include a Ni—Fe alloy doped with Vanadium. Vanadium may have a concentration of 10 atomic percent and the Ni—Fe alloy may have a concentration of 90 atomic percent. Within the Ni—Fe alloy, Ni may have a concentration of 80 atomic percent and Fe may have a concentration of 20 atomic percent. In one example, fixed magnetic layer 312 may be 25 Angstroms in thickness. In general, magnetic layers may have a thickness of 10 Angstroms to 25 Angstroms. The magnetic alloy may be a Ni—Co alloy, a Fe—Co alloy, or a Co—Ni—Fe alloy. In another example, magnetic layers may include a Ni—Fe alloy doped with Zirconium (Zr), such as $Zr_z(Ni_{80}Fe_{20})_{1-z}$, where a concentration of Zirconium may be varied in a range between 2 atomic percent to 20 atomic percent. In other examples, magnetic layers may include a Ni—Fe alloy doped with Molybdenum or Hafnium. Non-magnetic layer 320 may include at least one of Vanadium (V), Molybdenum (Mo), Copper (Cu), Aluminum (Al), Tantalum (Ta), or Chromium (Cr). Any of the layers described with respect to FIG. 3 may be formed using physical vapor deposition (PVD) techniques, such as sputtering. Although FIG. 3 shows a certain number of layers of MJJ device 300 arranged in a certain manner, there could be more or fewer layers arranged differently.

Figure 4:
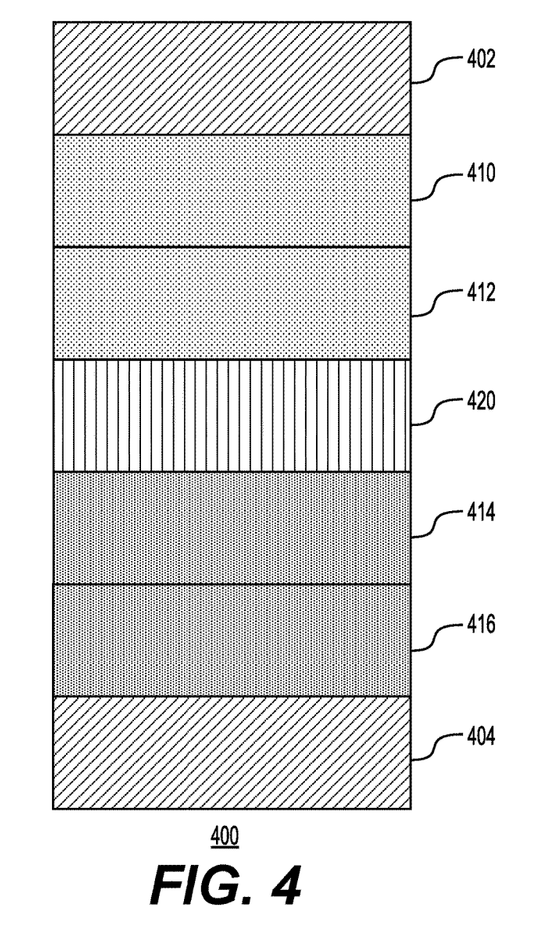
FIG. 4 shows a MJJ device in accordance with one example.

FIG. 4 shows a MJJ device 400 in accordance with one example. In one example, MJJ device 220 and MJJ device 224 of FIG. 2 may be configured as MJJ device 400. In this example, MJJ device 400 may include a conductive layer 402 and another conductive layer 404, as shown in FIG. 4. In this example, conductive layer 402 and conductive layer 404 may be formed using Niobium. In this example, the thickness of each of these conductive layers may be 100 Angstroms to 500 Angstroms. MJJ device 400 may include two free magnetic layers 410 and 412, as shown in FIG. 4. MJJ device 400 may further include two fixed magnetic layers 414 and 416. MJJ device 400 may further include non-magnetic layer 420, which may be sandwiched between a free magnetic layer 412 and a fixed magnetic layer 414. Thus, in this example, free magnetic layers 410 and 412 may be formed above non-magnetic layer 420 and fixed magnetic layers 414 and 416 may be formed below non-magnetic layer 420. There could be intervening layers between any of these layers. The terms above and below are merely used to indicate that free magnetic layers 410 and 412 are on one side of non-magnetic layer 420 and fixed magnetic layers 414 and 416 are formed on the other side of non-magnetic layer 420. These terms do not imply a particular order of creating these layers. In other words, in the context of this disclosure, above may mean below and below may mean above.

In one example, free magnetic layers 410 and 412 may have very soft magnetic properties to allow for switching of the magnetization direction in response to small magnetic fields. As an example, at liquid helium temperature, free magnetic layers 410 and 412 may have saturation magnetization below 350 emu/cc, a coercivity value of less than 10 Oersted, and an anisotropy field value of less than 20 Oersted. Free magnetic layers 410 and 412 may include doped alloy $V_{20}(Ni_{75}Fe_{25})_{50}$. Thus, free magnetic layer 410 and 412 may include a Nickel-Iron (Ni—Fe) alloy doped with Vanadium (V). Vanadium may have a concentration of 20 atomic percent and the Ni—Fe alloy may have a concentration of 80 atomic percent. Within the Ni—Fe alloy, Ni may have a concentration of 75 atomic percent and Fe may have a concentration of 25 atomic percent. In one example, Vanadium may have a concentration of 1-40 atomic percent and the Ni—Fe alloy may have a concentration of 60-99 atomic percent. Within Ni—Fe alloy, Ni may have a concentration between 75 atomic percent to 95 atomic percent and Fe may have a concentration between 5 atomic percent to 25 atomic percent. In one example, each of free magnetic layer 410 and 412 may be 15 Angstroms in thickness. In this example, fixed magnetic layers 414 and 416 may be formed using an un-doped magnetic alloy. In another example, fixed magnetic layers 414 and 416 may have a lower amount of doping than free magnetic layers 410 and 412. In one example, each fixed magnetic layer 414 and 416 may have a larger hysteresis than the hysteresis for free magnetic layers 410 and 412. Fixed magnetic layers 414 and 416 may also have a larger coercivity value (HC) compared to free magnetic layers 410 and 412. Fixed magnetic layers 414 and 416 may also have a large squareness (remnant magnetization (MR)/saturation magnetization (MS) ratio). The thickness of fixed magnetic layers 414 and 416 may be selected to enable the transition of MJJ device between a "zero state" and a "π state." As an example, fixed magnetic layer 414 and 416 may include doped alloy $V_{10}(Ni_{80}Fe_{20})_{90}$. Thus, fixed magnetic layer 414 and 416 may include a Ni—Fe alloy doped with Vanadium. Vanadium may have a concentration of 10 atomic percent and the Ni—Fe alloy may have a concentration of 90 atomic percent. Within the Ni—Fe alloy, Ni may have a concentration of 80 atomic percent and Fe may have a concentration of 20 atomic percent. In one example, each of the fixed magnetic layers may be 25 Angstroms in thickness. In general, magnetic layers may have a thickness of 10 Angstroms to 25 Angstroms. The magnetic alloy may be a Ni—Co alloy, a Fe—Co alloy, or a Co—Ni—Fe alloy. In another example, magnetic layers may include a Ni—Fe alloy doped with Zirconium (Zr), such as $Zr_z(Ni_{80}Fe_{20})_{1-z}$, where Zirconium may have a concentration between 2 atomic percent to 20 atomic percent. In other examples, magnetic layers may include a Ni—Fe alloy doped with Molybdenum or Hafnium. Non-magnetic layer 420 may include at least one of Vanadium (V), Molybdenum (Mo), Copper (Cu), Aluminum (Al), Tantalum (Ta), or Chromium (Cr). Any of the layers described with respect to FIG. 4 may be formed using physical vapor deposition (PVD) techniques, such as sputtering. Although FIG. 4 shows a certain number of layers of MJJ device 400 arranged in a certain manner, there could be more or fewer layers arranged differently.

Figure 5:
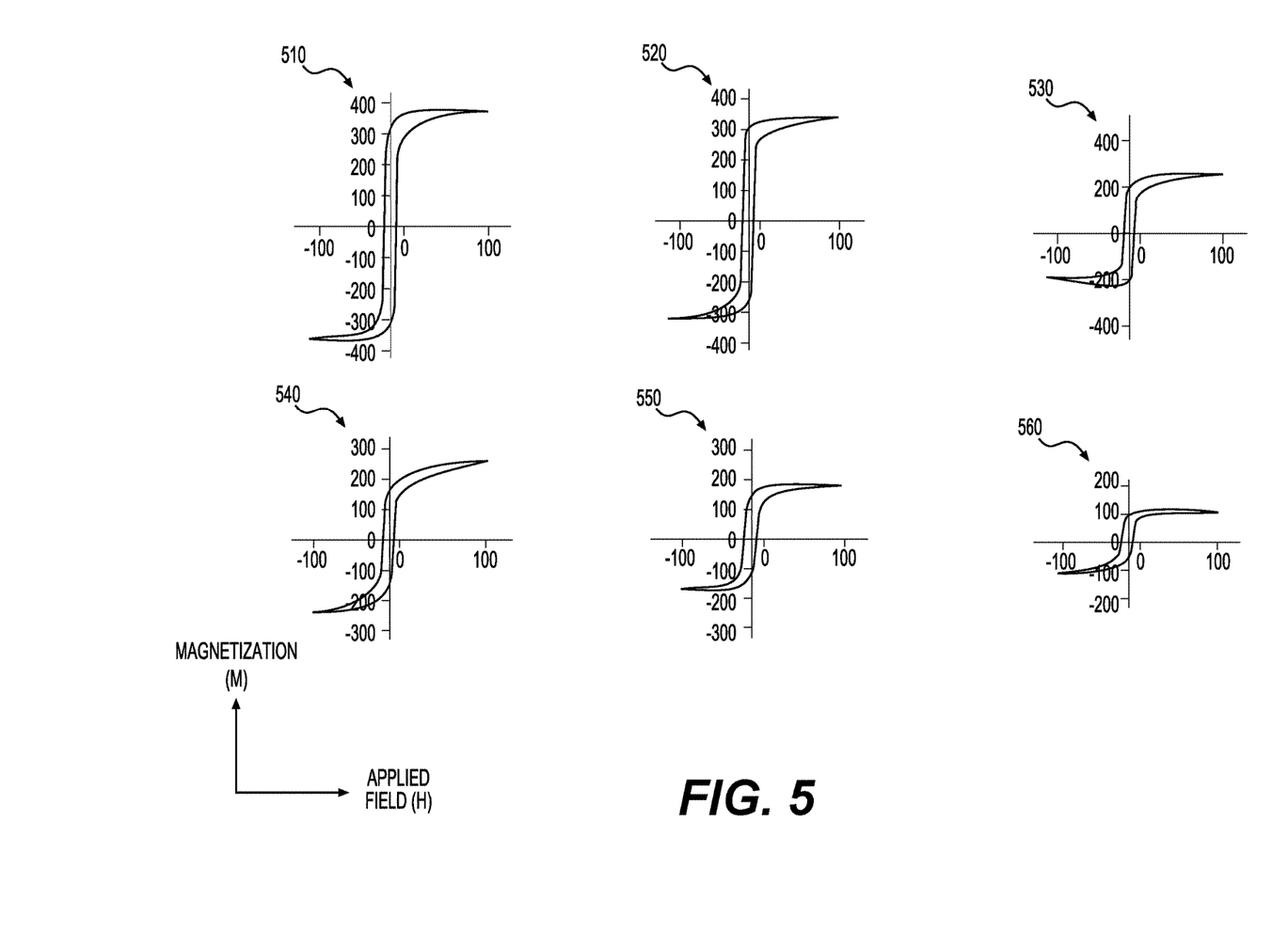
FIG. 5 shows hysteresis curves for a MJJ device in accordance with one example.

FIG. 5 shows hysteresis curves for a MJJ device (e.g., MJJ devices 300 and 400) with varying concentrations of Vanadium, Nickel, and Iron in the free magnetic layer in accordance with one example. Each of the hysteresis curves shows the change in the magnetization (M) of the free magnetic layer in response to an applied magnetic field (H) at liquid helium temperature. As shown in each of the curves 510, 520, 530, 540, 550, and 560, the concentrations of the dopant and the nickel-iron alloy are selected such that the range of saturation magnetization (MS) for the free magnetic layer of the MJJ device is in a range between 50 to 400 emu/cc. Alternatively, expressed differently, the saturation magnetization for the free magnetic layer of the MJJ device is in a range between 50 kA/m to 400 kA/m. In addition, in each of the curves, the coercivity (HC) values are less than 10 Oersted. Curves 510, 520, and 530 show the change in magnetization with a concentration of Vanadium set at 10 atomic percent in a nickel-iron alloy. Curve 510 shows the change in magnetization of the free magnetic layer comprising $V_{10}(Ni_{80}Fe_{20})_{90}$. In this case the saturation magnetization of the free magnetic layer is approximately 400 emu/cc. Curve 520 shows the change in magnetization of the free magnetic layer comprising $V_{10}(Ni_{85}Fe_{15})_{90}$. In this case the saturation magnetization of the free magnetic layer is approximately 350 emu/cc. Curve 520 shows the change in magnetization of the free magnetic layer comprising $V_{10}(Ni_{90}Fe_{10})_{90}$. In this case the saturation magnetization of the free magnetic layer is approximately 200 emu/cc. Curves 540, 550, and 560 show the change in magnetization with a concentration of Vanadium set at 15 atomic percent in a nickel-iron alloy. Curve 540 shows the change in magnetization of the free magnetic layer comprising $V_{15}(Ni_{80}Fe_{20})_{85}$. In this case the saturation magnetization of the free magnetic layer is approximately 350 emu/cc. Curve 550 shows the change in magnetization of the free magnetic layer comprising $V_{15}(Ni_{85}Fe_{15})_{85}$. In this case the saturation magnetization of the free magnetic layer is approximately 200 emu/cc. Curve 560 shows the change in magnetization of the free magnetic layer comprising $V_{15}(Ni_{90}Fe_{10})_{85}$. In this case the saturation magnetization of the free magnetic layer is approximately 100 emu/cc. Any of the combinations of these doped alloys may be used to form the free magnetic layer of the MJJ devices discussed previously.

Figure 6:
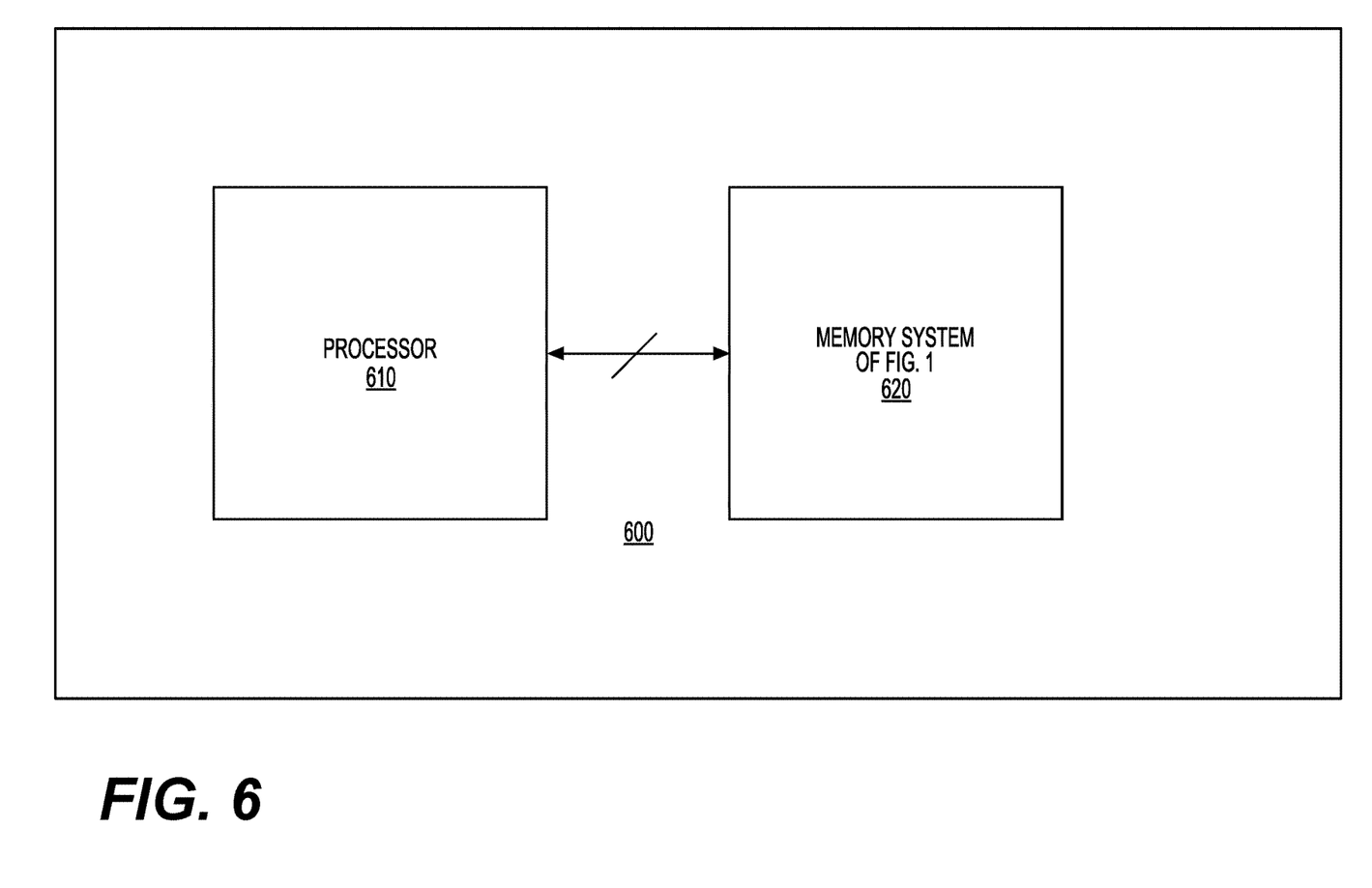
FIG. 6 shows a computing system including a memory, coupled to a processor, in accordance with one example.

FIG. 6 shows a computing system 600 including a processor 610 coupled to a memory 620 (e.g., memory system 100 of FIG. 1) in accordance with one example. Processor 610 may perform read or write operations on memory 620 in a manner as explained earlier. Additionally, processor 610 and memory 620 may be used along with other superconducting logic based devices. In general, any superconducting device operating in cryogenic environments and requiring storage of instructions or data may include memory 620. Furthermore, processor 610 need not be in a cryogenic environment; instead, it may operate at non-cryogenic temperatures. In this example, memory 620 may be in a separate cryogenic environment and may be coupled via connectors to processor 610 in a way that the cryogenic environment can be maintained. Memory 620 may be used as part of storage in a data center for delivering cloud-based services, such as software as a service, platform as a service, or other services.

In conclusion, the present disclosure relates to a memory cell including a magnetic Josephson junction (MJJ) device. The MJJ device may include at least a first layer formed above a second layer and a third layer formed below the second layer, where the first layer is a free magnetic layer, the second layer is a non-magnetic layer, where the third layer is a fixed magnetic layer. The free magnetic layer may comprise a magnetic alloy doped with at least one of Vanadium, Zirconium, Molybdenum, or Hafnium, and the fixed magnetic layer may comprise an un-doped second magnetic alloy. The magnetic alloy may comprise at least one of a nickel-iron alloy, a nickel-cobalt alloy, an iron-cobalt alloy, or a cobalt-nickel-iron alloy. The free magnetic layer may comprise the magnetic alloy doped with only Vanadium. A concentration of the Vanadium may be in a range between 5 atomic percent to 40 atomic percent of the magnetic alloy doped with only Vanadium. The free magnetic layer may comprise the magnetic alloy doped with only Zirconium. A concentration of the Zirconium may be in a range between 2 atomic percent to 20 atomic percent of the magnetic alloy doped with only Zirconium. The non-magnetic layer may comprise at least one of Vanadium, Molybdenum, Copper, Aluminum, Tantalum, or Chromium.

The memory cell may be configured to be in a first magnetization state or a second magnetization state, and where the first magnetization state may correspond to a first configuration of magnetization of the free magnetic layer and the second magnetization state may correspond to a second configuration of magnetization of the free magnetic layer, where the first configuration of the magnetization of the free magnetic layer may correspond to a first magnetic field that is parallel to a magnetic field of the fixed magnetic layer and the second configuration of the magnetization of the free magnetic layer may correspond to a second magnetic field that is anti-parallel to the magnetic field of the fixed magnetic layer. The memory cell may further comprise a fourth layer formed above the first layer and a fifth layer formed below the third layer, where each of the fourth layer and the fifth layer may comprise Niobium.

In another aspect, the present disclosure relates to a memory cell including a magnetic Josephson junction (MJJ) device. The MJJ device may include a first layer formed above a second layer and a third layer formed below the second layer. The first layer may be a free magnetic layer; the second layer may be a non-magnetic layer; and the third layer may be a fixed magnetic layer. The free magnetic layer may comprise a nickel-iron alloy doped with only Vanadium, where a concentration of the Vanadium may be in a range between 5 atomic percent to 20 atomic percent. The fixed magnetic layer may comprise a nickel-iron alloy doped with only Vanadium, where a concentration of the Vanadium may be between 5 atomic percent to 10 atomic percent. The non-magnetic layer may comprise at least one of Vanadium, Molybdenum, Copper, Aluminum, Tantalum, or Chromium. The memory cell may be configured to be in a first magnetization state or a second magnetization state, and where the first magnetization state may correspond to a first configuration of magnetization of the free magnetic layer and the second magnetization state may correspond to a second configuration of magnetization of the free magnetic layer, where the first configuration of the magnetization of the free magnetic layer may correspond to a first magnetic field that is parallel to a magnetic field of the fixed magnetic layer and the second configuration of the magnetization of the free magnetic layer may correspond to a second magnetic field that is anti-parallel to the magnetic field of the fixed magnetic layer. The free magnetic layer may have a thickness between 10 Angstroms to 25 Angstroms. The fixed magnetic layer may have a thickness between 10 Angstroms to 25 Angstroms. The memory cell may further include a fourth layer formed above the first layer and a fifth layer formed below the third layer, where each of the fourth layer and the fifth layer may comprise niobium.

In yet another aspect, the present disclosure relates to a memory cell including a magnetic Josephson junction (MJJ) device. The MJJ device may include at least: (1) a first layer and a second layer formed above a third layer, and (2) a fourth layer and a fifth layer formed below the third layer. Each of the first layer and the second layer may be a free magnetic layer; the third layer may be a non-magnetic layer; and each of the fourth layer and the fifth layer may be a fixed magnetic layer. Each of the free magnetic layers may comprise a magnetic alloy doped with at least one of Vanadium, Zirconium, Molybdenum, or Hafnium. Each of the fixed magnetic layers may comprise an un-doped second magnetic alloy. The magnetic alloy may comprise at least one of a nickel-iron alloy, a nickel-cobalt alloy, an iron-cobalt alloy, or a cobalt-nickel-iron alloy. The free magnetic layer may comprise the magnetic alloy doped with only Vanadium. A concentration of the Vanadium may be in a range between 5 atomic percent to 40 atomic percent of the magnetic alloy doped with only Vanadium. The free magnetic layer may comprise the magnetic alloy doped with only Zirconium. A concentration of the Zirconium may be in a range between 2 atomic percent to 20 atomic percent of the magnetic alloy doped with only Zirconium. The non-magnetic layer may comprise at least one of Vanadium, Molybdenum, Copper, Aluminum, Tantalum, or Chromium.

It is to be understood that the methods, modules, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine, such as processor 610, to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A memory cell, wherein the memory cell is configured to be either in a voltage state or a zero state, the memory cell comprising:

a read bit-line;

a read word-line;

a first magnetic Josephson junction (MJJ) device connected to the read bit-line via a first inductor, the first MJJ device comprising at least a first layer formed above a second layer and a third layer formed below the second layer, wherein the first layer is a free magnetic layer, the second layer is a non-magnetic layer, wherein the third layer is a fixed magnetic layer, wherein the free magnetic layer comprises a magnetic alloy doped with at least one of Vanadium, Zirconium, Molybdenum, or Hafnium, and wherein the fixed magnetic layer comprises an un-doped second magnetic alloy; and a second magnetic Josephson junction (MJJ) device connected to the read bit-line via a second inductor, the second MJJ device comprising at least a fourth layer formed above a fifth layer and a sixth layer formed below the fifth layer, wherein the fourth layer is a free magnetic layer, the fifth layer is a non-magnetic layer, wherein the sixth layer is a fixed magnetic layer, wherein the free magnetic layer comprises a magnetic alloy doped with at least one of Vanadium, Zirconium, Molybdenum, or Hafnium, and wherein the fixed magnetic layer comprises an un-doped second magnetic alloy, wherein during a read operation, the read word-line is configured to apply a word read current to the memory cell and the read bit-line is configured to apply a bit read current to the first MJJ device via the first inductor and to the second MJJ device via the second inductor to change a state of the memory cell from the zero state to the voltage state.

2. The memory cell of claim 1, wherein the magnetic alloy comprises at least one of a nickel-iron alloy, a nickel-cobalt alloy, an iron-cobalt alloy, or a cobalt-nickel-iron alloy.

3. The memory cell of claim 1, wherein the free magnetic layer comprises the magnetic alloy doped with only Vanadium.

4. The memory cell of claim 3, wherein a concentration of the Vanadium is in a range between 5 atomic percent to 40 atomic percent of the magnetic alloy doped with only Vanadium.

5. The memory cell of claim 1, wherein the free magnetic layer comprises the magnetic alloy doped with only Zirconium.

6. The memory cell of claim 5, wherein a concentration of the Zirconium is in a range between 2 atomic percent to 20 atomic percent of the magnetic alloy doped with only Zirconium.

7. The memory cell of claim 1, wherein the non-magnetic layer comprises at least one of Vanadium, Molybdenum, Copper, Aluminum, Tantalum, or Chromium.

8. The memory cell of claim 1, wherein the memory cell is configured to be in a first magnetization state or a second magnetization state, and wherein the first magnetization state corresponds to a first configuration of magnetization of the free magnetic layer and the second magnetization state corresponds to a second configuration of magnetization of the free magnetic layer, wherein the first configuration of the magnetization of the free magnetic layer corresponds to a first magnetic field that is parallel to a magnetic field of the fixed magnetic layer and the second configuration of the magnetization of the free magnetic layer corresponds to a second magnetic field that is anti-parallel to the magnetic field of the fixed magnetic layer.

9. The memory cell of claim 1 further comprising a seventh layer formed above the first layer and an eight layer formed below the third layer, wherein each of the seventh layer and the eight layer comprises Niobium.

10. The memory cell of claim 1, wherein, during the read operation, the read bit-line is configured to receive current from a bit-line driver in response to at least one control signal received via an address bus, wherein the at least one control signal comprises at least one single-flux-quantum (SFQ) pulse.

11. The memory cell of claim 1, wherein, during the read operation, the read word-line is configured to receive current from a word-line driver in response to at least one control signal received via an address bus, wherein the at least one control signal comprises at least one single-flux-quantum (SFQ) pulse.

12. A memory cell, wherein the memory cell is configured to be either in a voltage state or a zero state, the memory cell comprising:
read bit-line;
a read word-line;
a first magnetic Josephson junction (MJJ) device connected to the read bit-line via a first inductor, the first MJJ device comprising at least a first layer formed above a second layer and a third layer formed below the second layer, wherein the first layer is a free magnetic layer, the second layer is a non-magnetic layer, and the third layer is a fixed magnetic layer, wherein the free magnetic layer comprises a nickel-iron alloy doped with only Vanadium, wherein a concentration of the Vanadium is in a range between 5 atomic percent to 20 atomic percent, wherein the fixed magnetic layer comprises a nickel-iron alloy doped with only Vanadium, and wherein a concentration of the Vanadium is in a range between 5 atomic percent to 10 atomic percent; and a second magnetic Josephson junction (MJJ) device connected to the read bit-line via a second inductor, the second MJJ device comprising at least a fourth layer formed above a fifth layer and a sixth layer formed below the fifth layer, wherein the fourth layer is a free magnetic layer, the fifth layer is a non-magnetic layer, wherein the sixth layer is a fixed magnetic layer, wherein the free magnetic layer comprises a nickel-iron alloy doped with only Vanadium, wherein a concentration of the Vanadium is in a range between 5 atomic percent to 20 atomic percent, wherein the fixed magnetic layer comprises a nickel-iron alloy doped with only Vanadium, and wherein a concentration of the Vanadium is in a range between 5 atomic percent to 10 atomic percent, wherein during a read operation, the read word-line is configured to apply a word read current to the memory cell and the read bit-line is configured to apply a bit read current to the first MJJ device via the first inductor and to the second MJJ device via the second inductor to change a state of the memory cell from the zero state to the voltage state.

13. The memory cell of claim 12, wherein the non-magnetic layer comprises at least one of Vanadium, Molybdenum, Copper, Aluminum, Tantalum, or Chromium.

14. The memory cell of claim 12, wherein the memory cell is configured to be in a first magnetization state or a second magnetization state, and wherein the first magnetization state corresponds to a first configuration of magnetization of the free magnetic layer and the second magnetization state corresponds to a second configuration of magnetization of the free magnetic layer, wherein the first configuration of the magnetization of the free magnetic layer corresponds to a first magnetic field that is parallel to a magnetic field of the fixed magnetic layer and the second configuration of the magnetization of the free magnetic layer corresponds to a second magnetic field that is anti-parallel to the magnetic field of the fixed magnetic layer.

15. The memory cell of claim 12, wherein the free magnetic layer has a thickness between 10 Angstroms to 25 Angstroms.

16. The memory cell of claim 15, wherein the fixed magnetic layer has a thickness between 10 Angstroms to 25 Angstroms.

17. The memory cell of claim 12, wherein, during the read operation, the read bit-line is configured to receive current from a bit-line driver in response to at least one control signal received via an address bus, wherein the at least one control signal comprises at least one single-flux-quantum (SFQ) pulse.

18. The memory cell of claim 12, wherein, during the read operation, the read word-line is configured to receive current from a word-line driver in response to at least one control signal received via an address bus, wherein the at least one control signal comprises at least one single-flux-quantum (SFQ) pulse.

* * * * *